United States Patent [19]

Yamazaki

[11] Patent Number: 4,593,151

[45] Date of Patent: Jun. 3, 1986

[54] PHOTOELECTRIC CONVERSION DEVICE

[75] Inventor: Shunpei Yamazaki, Tokyo, Japan

[73] Assignee: Semiconductor Energy Laboratory Co., Ltd., Japan

[21] Appl. No.: 760,957

[22] Filed: Jul. 31, 1985

Related U.S. Application Data

[62] Division of Ser. No. 620,171, Jun. 13, 1984, which is a division of Ser. No. 554,807, Nov. 23, 1983, Pat. No. 4,527,006.

[30] Foreign Application Priority Data

| Nov. 24, 1982 | [JP] | Japan | 57-206809 |
| Nov. 24, 1982 | [JP] | Japan | 57-206806 |
| Feb. 22, 1983 | [JP] | Japan | 58-28211 |
| Apr. 29, 1983 | [JP] | Japan | 58-75713 |
| Oct. 31, 1983 | [JP] | Japan | 58-2044443 |

[51] Int. Cl.$^4$ ............... H01L 27/14; H01L 31/06
[52] U.S. Cl. .................... 136/244; 136/258
[58] Field of Search ....... 136/244, 246, 256, 258 AM, 136/259

[56] References Cited

U.S. PATENT DOCUMENTS 4,315,096  2/1982  Tyan et al. .................... 136/244

Primary Examiner—Aaron Weisstuch
Attorney, Agent, or Firm—Gerald J. Ferguson, Jr.

[57] ABSTRACT

A plurality n of semiconductor elements $U_i$ to $U_n$ are sequentially formed on a substrate side by side and connected in series. The element $U_i$ (where i=1, 2, ... n) has a first electrode $E_i$ formed on the substrate, a non-single-crystal semiconductor laminate member $Q_i$ formed on the electrode $E_i$ and a second electrode $F_i$ formed on the laminate member $Q_i$. The electrode $F_{j+1}$ (j=1, 2, ... (n−1)) is coupled with the electrode $E_j$ via a coupling portion $K_j$ formed by an extension of the electrode $F_{j+1}$. The laminate member $Q_i$ has an N (or P) type first semiconductor layer, an I type second semiconductor layer and P (or N) type third semiconductor layer. The second electrode $F_i$ and the coupling portion $K_j$ are formed by a layered member having a conductive metal oxide layer making contact with the non-single-crystal semiconductor laminate member $Q_i$ and a conductive material layer formed on the metal oxide layer where the second conductive material layer of the second electrode $F_i$ is a layer formed of chromium or a material consisting principally thereof.

10 Claims, 37 Drawing Figures

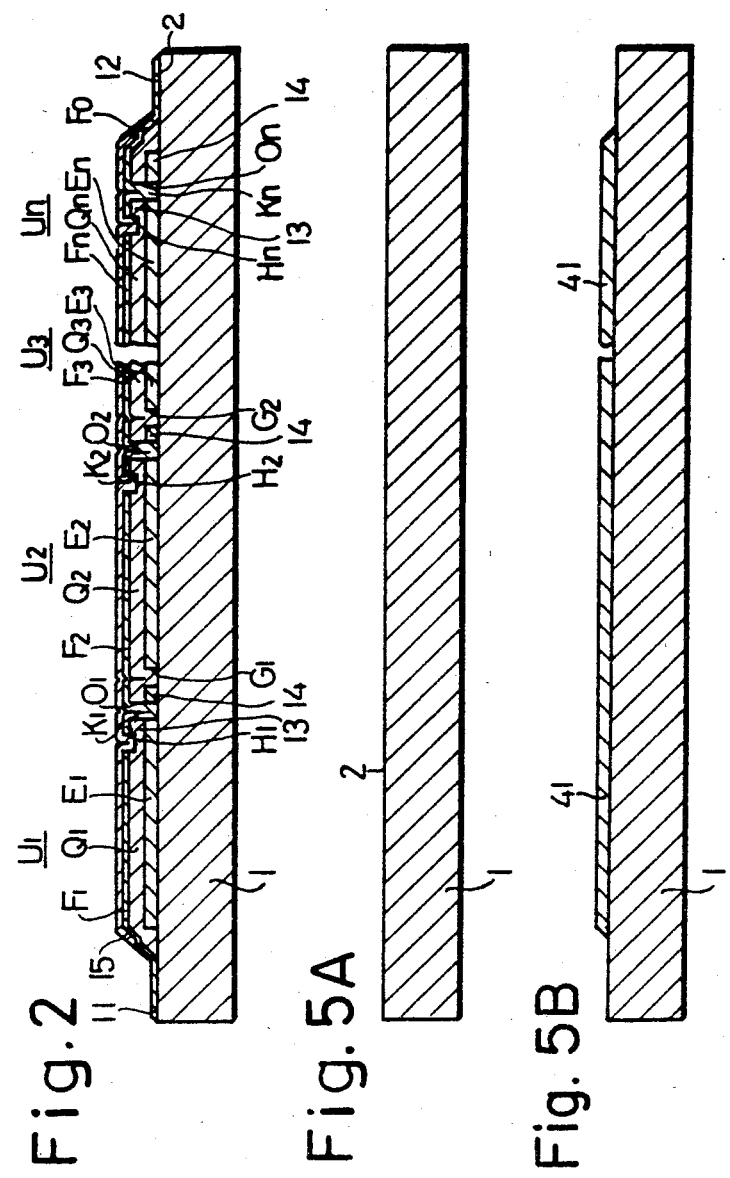

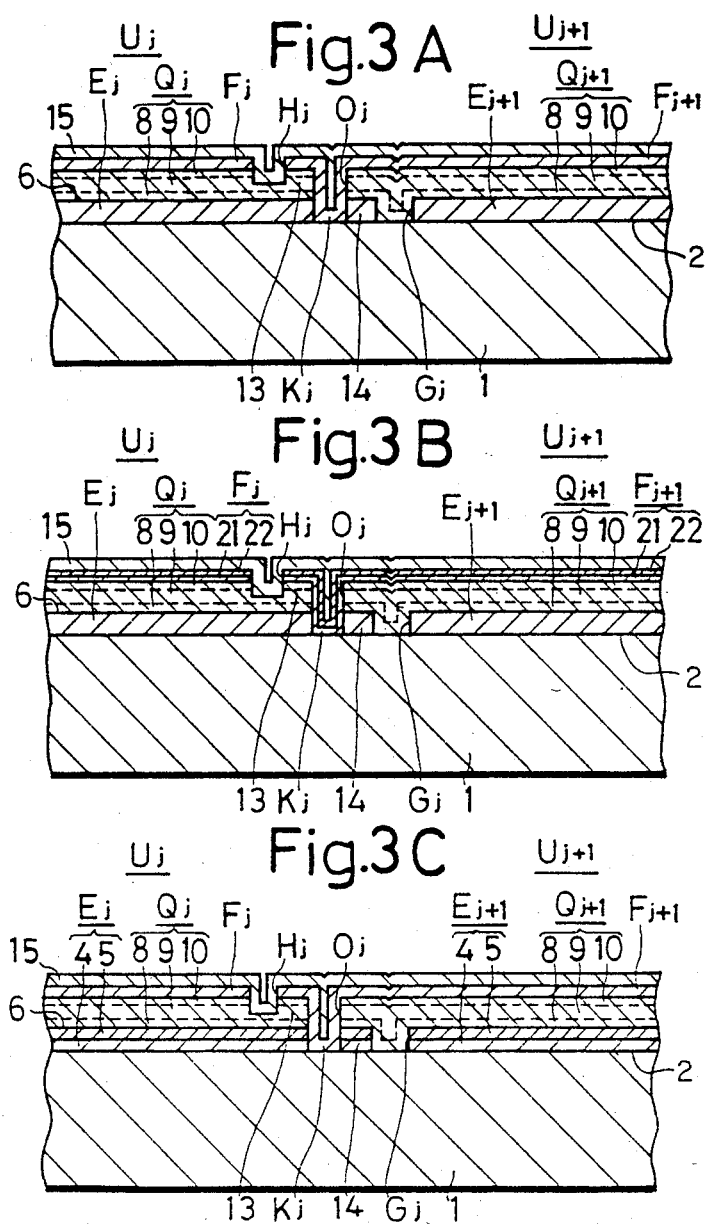

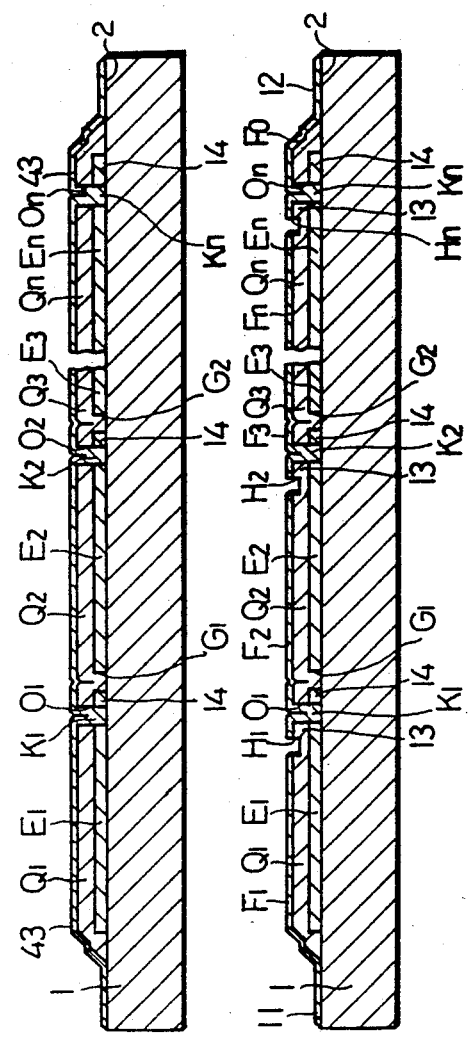

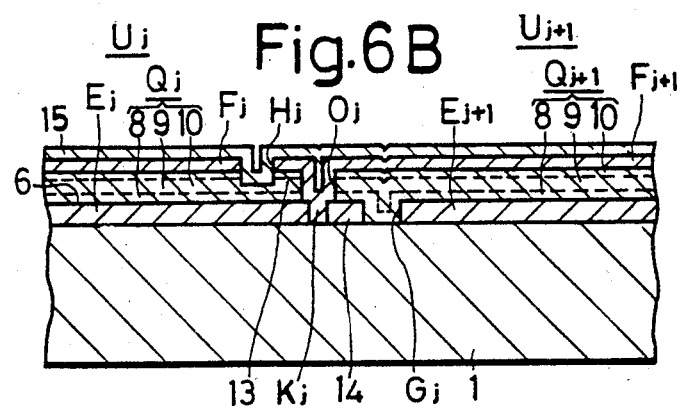
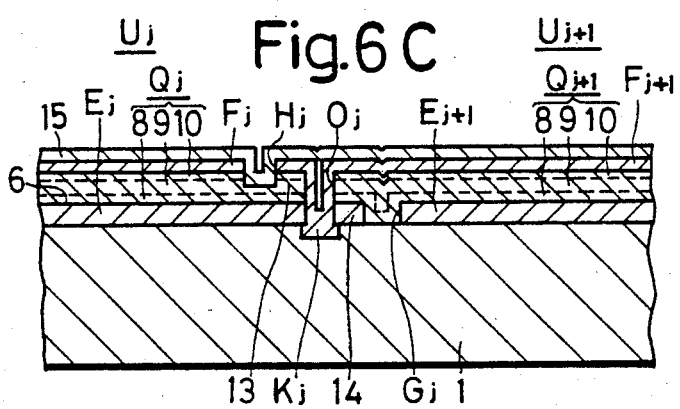
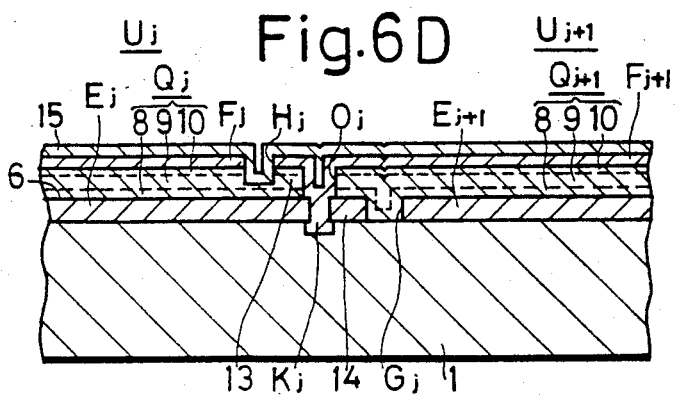

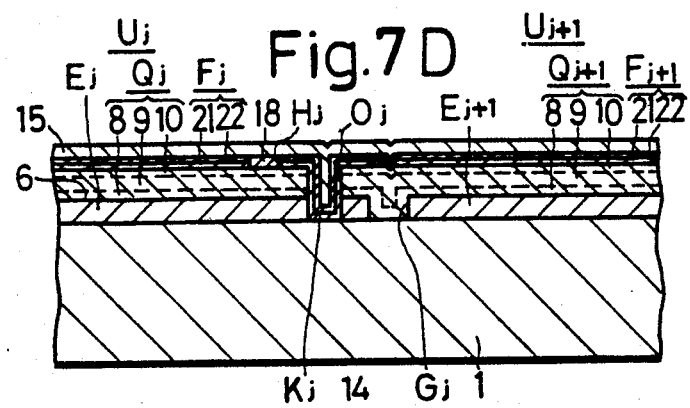
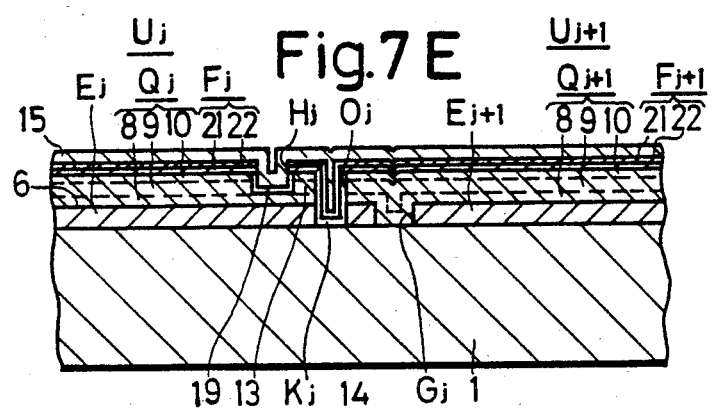
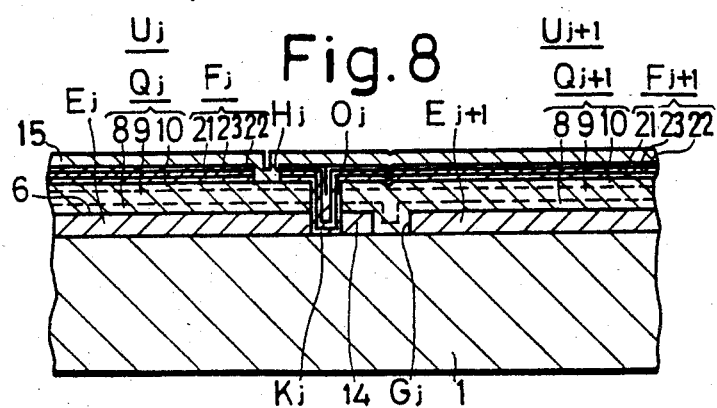

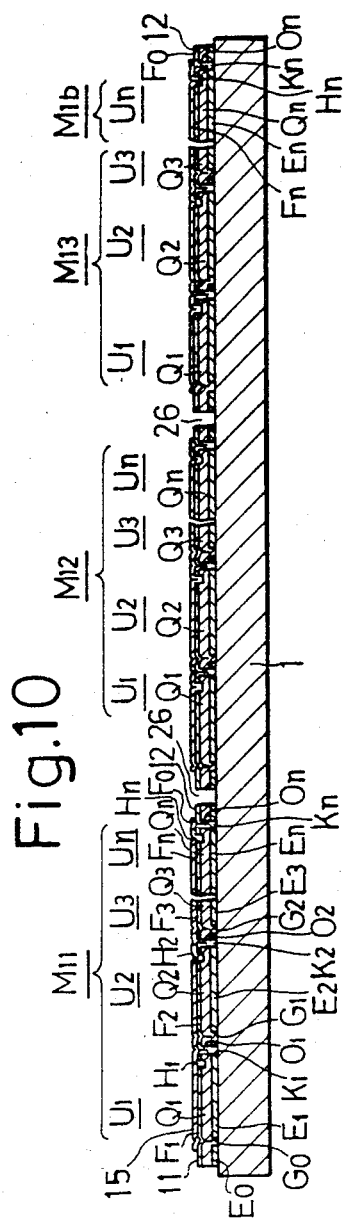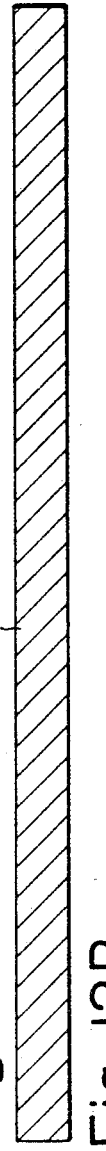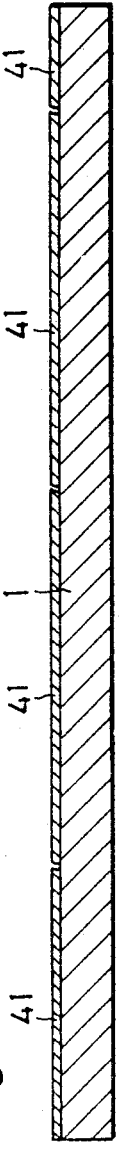

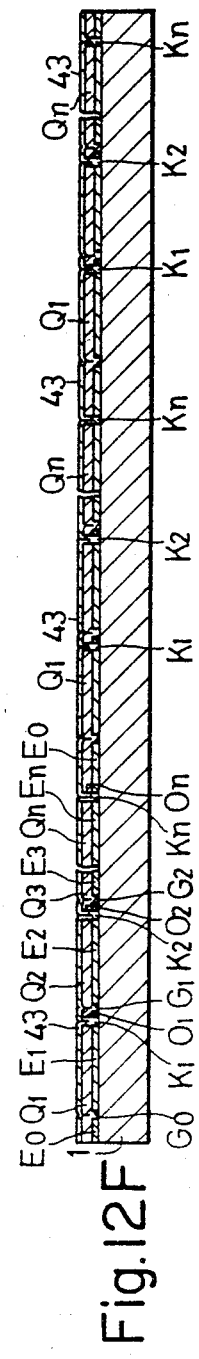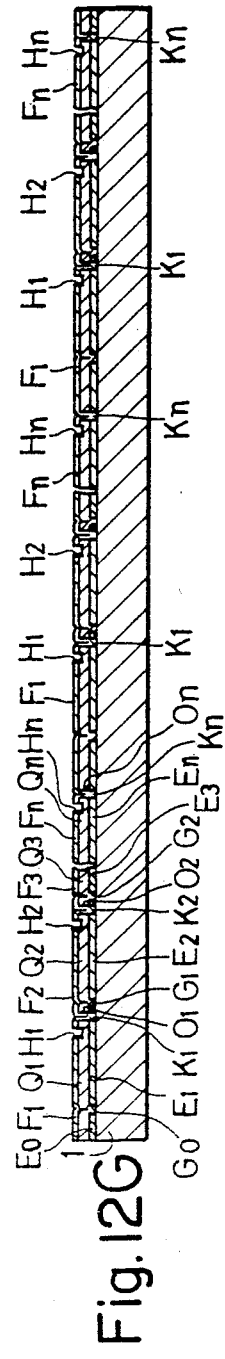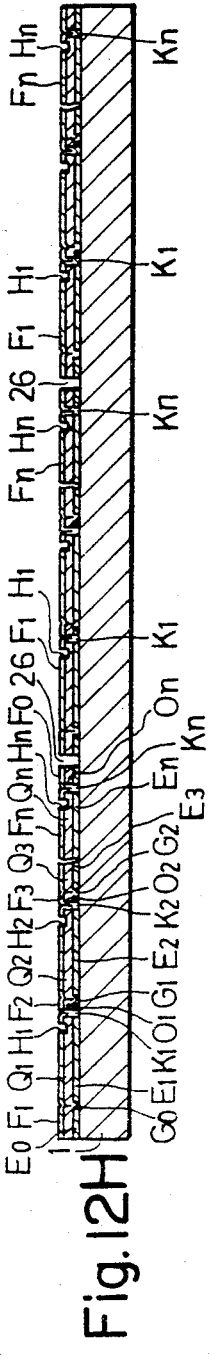

PHOTOELECTRIC CONVERSION DEVICE

This is a divisional application of Ser. No. 620,171, filed June 13, 1984, which in turn is a divisional application of Ser. No. 554,807, filed Nov. 23, 1983, now U.S. Pat. No. 4,527,006.

BACKGROUND OF THE INVENTION

1. Field of the Invention

The present invention relates to improvement in or relating to a photoelectric conversion device in which a number of semiconductor elements are sequentially arranged on a substrate in side-by-side relation and connected in series. The invention also pertains to a method for the manufacture of such a photoelectric conversion device.

2. Description of the Prior Art

There has been proposed in U.S. Pat. No. 4,315,096 a photoelectric conversion device of the type wherein a plurality n (n being an integer greater than one) of semiconductor elements $U_i$ to $U_n$ are sequentially formed side by side on a substrate having an insulating surface and are connected in series one after another.

According to this semiconductor photoelectric conversion device, the semiconductor element $U_i$ ($i=1, 2, \ldots n$) has a first electrode $E_i$ formed on the substrate, a non-single-crystal semiconductor laminate member $Q_i$ formed on the first electrode $E_i$ to form at least one semiconductor junction and a second electrode $F_i$ formed on the non-single-crystal semiconductor laminate member $Q_i$ in opposing relation to the first electrode $E_i$. The second electrode $F_{j+1}$ of the semiconductor element $U_{j+1}$ ($J=1, 2, \ldots (n-1)$) is coupled with the first electrode $E_j$ of the semiconductor element $U_j$ through an extension $K_j$ of the second electrode $F_{j+1}$.

In such a photoelectric conversion device, in order to prevent lowering of its photoelectric conversion efficiency, it is necessary that the non-single-crystal semiconductor laminate member $Q_i$ and the second electrode $F_i$ be held in good contact with each other for a long period of time.

In the photoelectric conversion device of the abovesaid U.S. patent, however, no particular attention is paid to such a structure that ensures retention of good contact between the non-single-crystal semiconductor laminate member $Q_i$ and the second electrode $F_i$.

Accordingly, this conventional photoelectric conversion device has the defect that high photoelectric conversion efficiency cannot be maintained for a long period of time.

Further, it is described in the abovesaid U.S. patent that the second electrode $F_i$ is formed by a conductive layer through laser beam scanning. But it is not taken into account that during the laser beam scanning a conductive material forming the conductive layer enters into the non-single-crystal semiconductor laminate member to impair the electrical insulation between the second electrodes $F_j$ and $F_{j+1}$. Accordingly, the electrical insulation between the second electrodes $F_j$ and $F_{j+1}$ is poor.

Therefore the photoelectric conversion device of the abovesaid U.S. patent has the defect of low photoelectric conversion efficiency.

SUMMARY OF THE INVENTION

It is therefore an object of the present invention to provide a novel photoelectric conversion device which is free from the abovesaid defects.

In accordance with an aspect of the present invention, as is the case with the photoelectric conversion device of the aforementioned U.S. patent, a plurality n of semiconductor elements $U_1$ to $U_n$ are formed on a substrate having an insulating surface, and the semiconductor element $U_i$ has a first electrode $E_i$, a non-single-crystal semiconductor laminate member $Q_i$ and a second electrode $F_i$, and the first electrode $F_{j+1}$ is disposed to make contact with the second electrode $E_j$ through a coupling portion $K_j$ formed by an extension of the first electrode $F_{j+1}$.

According to the photoelectric conversion device of the present invention, however, the second electrode $F_i$ is formed by a layered member which is comprised of a conductive metal oxide layer contacting the non-single-crystal semiconductor laminate member $Q_i$ and a conductive layer formed on the metal oxide layer.

Since the oxide which forms the metal oxide layer of the second electrode $F_i$ contacting the non-single-crystal semiconductor laminate member $Q_i$ is stable chemically, the metal oxide layer is not degraded by the long-term use of the device and is difficult to react with the non-single-crystal semiconductor laminate member $Q_i$. This ensures maintenance of good contact between the non-single-crystal semiconductor laminate member $Q_i$ and the second electrode $F_i$ and prevention of deterioration of the characteristics of the non-single-crystal semiconductor laminate member $Q_i$ for a long period of time.

Accordingly, it is possible with the photoelectric conversion device of the present invention to obtain high photoelectric conversion efficiency.

Further, according to the present invention, light incident on the second electrode $F_i$ passing through the non-single-crystal semiconductor laminate member from the side of the substrate can be reflected by the conductive layer of the second electrode $F_i$ back to the non-single-crystal semiconductor laminate member $Q_i$. This improves the efficiency of utilization of light.

Accordingly, the photoelectric conversion device of the present invention is capable of providing high photoelectric conversion efficiency for a long period of time.

Moreoever, according to the present invention, by forming the conductive layer of the second electrode $F_i$ of a sublimable metal, the electrical insulation between the second electrodes $F_j$ and $F_{j+1}$ is held high. The reason for this is that when the second electrode $F_i$ is formed by laser beam scanning of a conductive layer having a metal oxide layer and a sublimable metal layer formed thereon according to the manufacturing method of the present invention described later, the metal forming the sublimable metal layer enters into the non-single-crystal semiconductor laminate member $Q_j$.

Accordingly, high photoelectric conversion efficiency can be obtained with the photoelectric conversion device of the present invention.

According to the manufacturing method of the present invention, the semiconductor elements are formed by a process including the following steps (a) to (d):

(a) A first light-transparent conductive layer, which will ultimately serve as a first electrode of each semiconductor element, is formed on the light-transparent substrate and the first light-transparent conductive layer is subjected to a first scanning by a laser beam, thereby providing the first light-transparent electrode of each semiconductor element.

(b) A non-single-crystal semiconductor laminate member which will ultimately serve as a non-single-crystal semiconductor laminate member of each semiconductor element having formed therein at least one semiconductor junction is formed on the light-transparent substrate in such a manner as to cover the first electrode of each semiconductor element, providing the non-single-crystal semiconductor laminate member thereof.

(c) The non-single-crystal semiconductor of the semiconductor elements are subjected to a second scanning by a laser beam, thereby cutting therein grooves to expose the first light-transparent electrodes to the outside.

(d) A second conductive layer, which is a layered member having a conductive metal oxide layer and a reflective or sublimable conductive layer and which will ultimately serve as a second electrode of each semiconductor element is formed to extend on the non-single-crystal semiconductor laminate members and in the grooves, and then the second conductive layer is subjected to third scanning by a laser beam, thereby providing the second electrode of each semiconductor element.

According to the manufacturing method of the present invention including the abovesaid steps, the second electrode of each semiconductor element has the conductive metal oxide layer, and the conductive metal oxide layer is in contact with the non-single crystal semiconductor laminate member, so that the second electrode is formed to make good contact with the non-single-crystal semiconductor laminate member. Further, in the case where the second electrode has the reflective conductive layer, light incident thereon from the side of the substrate through the non-single-crystal semiconductor laminate member is reflected back thereto by the second electrode. Accordingly, it is possible to manufacture a photoelectric conversion device of high photoelectric conversion efficiency. Moreover, when the second electrode has the sublimable conductive layer, the second electrode can easily be formed by laser beam scanning of the second conductive layer with high precision. Accordingly, the photoelectric conversion can be manufactured with ease.

Other objects, features and advantages of the present invention will become more fully apparent from the following detailed description taken in conjunction with the accompanying drawings.

BRIEF DESCRIPTION OF THE DRAWINGS

FIG. 2 is a schematic sectional view taken on the line II—II in FIG. 1;

FIGS. 3A to D are detailed cross-sectional views showing on an enlarged scale parts of the embodiment of the present invention shown in FIG. 2.

FIGS. 5A to G are cross-sectional views schematically showing a sequence of steps involved in the manufacture of the photoelectric conversion device of the embodiment of the present invention depicted in FIGS. 1 to 4;

FIGS. 6A to D, 7A to E and 8 are schematic cross-sectional views, similar to FIG. 3, illustrating other embodiments of the present invention, respectively;

FIG. 10 is a schematic cross-sectional view taken on the line X—X in FIG. 9;

FIGS. 12A–H are schematic cross-sectional views showing a sequence of steps involved in the manufacture of the photoelectric conversion device depicted in FIG. 9 and 10.

DESCRIPTION OF THE PREFERRED EMBODIMENTS

A description will be given first, with reference to FIGS. 1 to 3, of an embodiment of the present invention.

Figure 1:
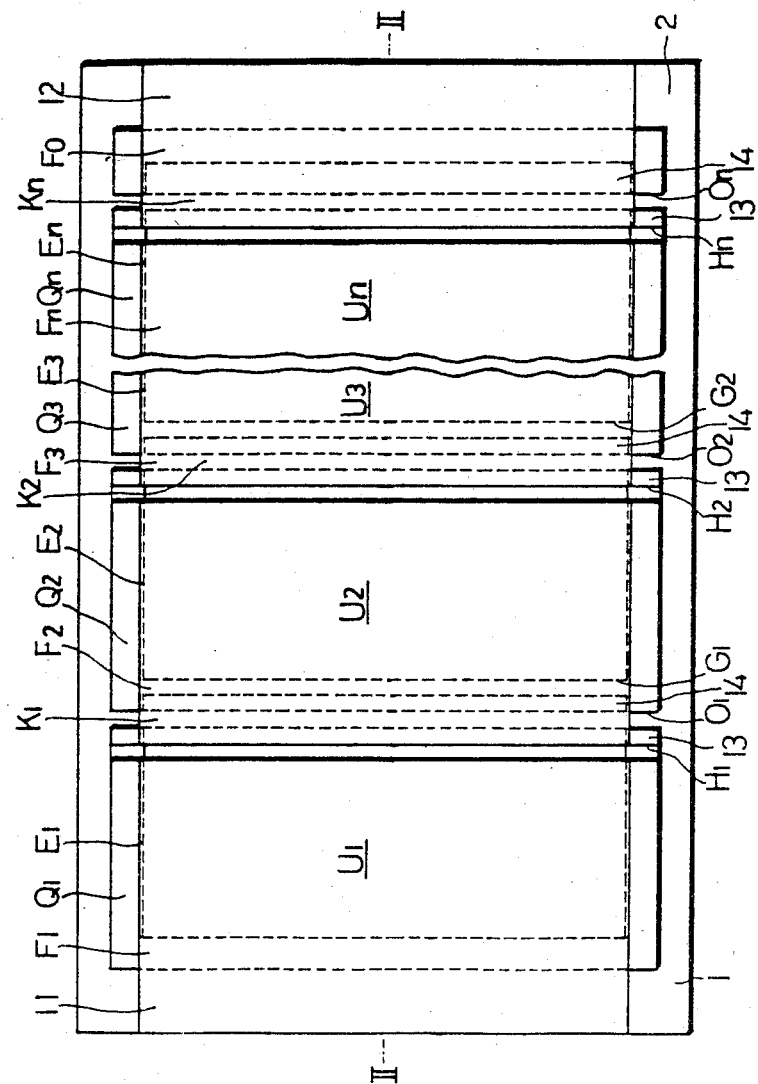
FIG. 1 is a plan view schematically illustrating an embodiment of the present invention.

The embodiment of the photoelectric conversion device of the present invention shown in FIGS. 1 to 3 has a plurality n (n being an integer larger than one) of semiconductor elements $U_1$ to $U_n$ formed side by side on a substrate 1.

The substrate 1 has an insulating surface 2.

The substrate 1 may be a light-transparent substrate made of glass, synthetic organic resin or the like, or a flexible sheet such as of synthetic organic resin. It is also possible to employ a non-light-transparent substrate of ceramics, organic resin or the like, a non-light-transparent metal substrate having its surface insulated, or a flexible, sheet-like member having an insulating film formed on the surface of a flexible metallic sheet. The substrate 1 is, for example, rectangular in shape and 20 cm wide and 60 cm long.

In the case of the substrate 1 being the abovesaid, flexible metallic sheet-like member, it is made, for instance, of aluminum or an aluminum-base alloy and has a thickness of, for example, 10 to 200 μm, preferably, 50 to 150 μm.

The insulating film formed on the surface of the flexible metallic sheet-like member is, for example, an oxide film resulting from oxidation of the surface of the sheet-like member. When the flexible metallic sheet-like member is made of aluminum or an aluminum-base alloy, the abovesaid oxide film is an aluminum oxide (alumina $Al_2O_3$) or an insulating material consisting principally of the aluminum oxide. The oxide film has a thickness small enough not to impair the flexibility of the flexible metallic sheet-like member, for instance, in the range of 0.1 to 2 μm, preferably 0.3 to 1 μm. Such an oxide film can be formed by heating the flexible metallic sheet-like member made of aluminum or the aluminum-base alloy.

The semiconductor element $U_i$ (i=1, 2, . . . n) on the substrate 1 has an electrode $E_i$ formed on the substrate 1, a non-single-crystal semiconductor laminate member $Q_i$ formed on the electrode $E_i$ and an electrode $F_i$ formed on the non-single-crystal semiconductor laminate member $Q_i$ in opposing relation to the electrode $E_i$.

The electrode $E_i$ is, for example, rectangular in shape and has a width of 5 to 40 mm, preferably 15 mm and a length slightly smaller than the width of the substrate 1.

Electrodes $E_j$ (j=1, 2, . . . (n−1)) and $E_{j+1}$ are spaced apart by a groove $G_j$ which is shown to extend in the vertical direction in FIG. 1. The groove $G_j$ is, for example, 40 μm wide.

The electrode $E_i$ may be a single-layer structure as shown in FIG. 3A.

The electrode $E_i$ may also be a two-layer structure which comprises a layer 4 making contact with the substrate 1 and a layer 5 formed on the layer 4 in contact with the non-single-crystal semiconductor laminate member $Q_i$ as shown in FIGS. 3C and D. Also it is possible to employ a three-layer structure having another layer sandwiched between the layers 4 and 5 though not shown.

The electrode $E_i$ may be a reflective electrode when the electrode $E_i$ is light-transparent. When the electrode $E_i$ is the reflective electrode, light incident on the non-single-crystal semiconductor laminate member $Q_i$ on the opposite side from the substrate 1 passes through the non-single-crystal semiconductor laminate member $Q_i$, then is reflected by the surface of the electrode $E_i$ back to the non-single-crystal semiconductor laminate member $Q_i$ to pass therethrough. The larger the optical path length of the reflected light in the non-single-crystal semiconductor laminate member $Q_i$ is, the more the utilization efficiency of light is raised. From this point of view, it is preferable that the surface of the electrode $E_i$ on the side of the non-single-crystal semiconductor laminate member $Q_i$ have irregularities oblique to planes perpendicular to the substrate surface to form a diffuse reflection surface 6 at the boundary between it and the non-single-crystal semiconductor laminate member $Q_i$.

In the case where the electrode $E_i$ is reflective, it may be of a single-layer structure formed by a reflective conductive layer.

In this case, the layer may be one that is formed of aluminum or silicon, or consisting principally thereof. In the case where the electrode $E_i$ is a reflective electrode and has the two-layer structure comprised of the layers 4 and 5, in order to simultaneously satisfy the requirements that the electrode $E_i$ be of high conductivity and high reflectivity and to prevent that when the non-single-crystal semiconductor laminate member $Q_i$ is formed, the material of its non-single-crystal semiconductor layer on the side of the electrode $E_i$ or an impurity contained therein reacts with the material of the reflective electrode to form a layer of high contact resistance in the interface between the electrode $E_i$ and the non-single-crystal semiconductor layer $Q_i$, it is preferable that the layer 4 be a reflective conductive layer and the layer 5 a light transparent metal oxide layer 5.

In the case where the layer 4 of the electrode $E_i$ is the reflective conductive layer, it may preferably be made of metal. The metal may be stainless steel but, in view of the requirements of high conductivity and high reflectivity for the electrode $E_i$, it is preferable to employ aluminum (Al), silver (Ag), an aluminum-base alloy containing, for example, 0.1 to 2 volume% of silicon, or a silver-base alloy.

When the layer 5 of the electrode $E_i$ is a light-transparent metal oxide layer, in order to ensure that the layer 5 be high in conductivity and in transmittance and to prevent that when the non-single-crystal semiconductor laminate layer $Q_i$ is formed, the metallic oxide reacts with the material or impurity of the non-single-crystal semiconductor layer of the laminate member $Q_i$ on the side of the electrode $E_i$ to form the abovesaid high contact resistance layer, it is preferable to form the layer 5 of a tin oxide ($SnO_2$ or $SnO$) or a metallic oxide consisting principally of such a tin oxide, for instance, a tin oxide containing halogen or, 1 to 10 wt% of antimony oxide, in the event that non-single-crystal semiconductor layer of the non-single-crystal semiconductor laminate member $Q_i$ on the side of the electrode $E_i$ is p-type. In the case where the layer of the non-single-crystal semiconductor laminate member $Q_i$ on the side of the electrode $E_i$ is N-type, it is preferable to use indium oxide or an oxide consisting principally thereof, for instance, an indium oxide containing 1 to 10 wt% of tin oxide. In this case, the light transparent conductive layer 5 is 300 to 600 Å thick.

In the case where the electrode $E_i$ is such a two-layer reflective electrode comprising the layer 4 and the layer 5, when the abovesaid diffuse reflection surface 6 is formed at the boundary between the electrode $E_i$ and the non-single-crystal semiconductor laminate member $Q_i$, it is formed on the surface of the layer 5 on the side of the laminate member $Q_i$.

In the case where the electrode $E_i$ is comprised of the layers 4 and 5 these layers are a reflective conductive layer and a light-transparent conductive layer to form a reflective electrode, the surface of the layer 4 may also be formed as the diffuse reflection surface in the interface between it and the light-transparent conductive layer 5, through not shown.

When the substrate 1 is light-transparent, the electrode $E_i$ is formed as a light-transparent electrode.

In such a case, the light-transparent electrode may be a metal oxide layer.

Where the electrode $E_i$ is a single-layer light-transparent electrode, when the non-single-crystal semiconductor layer of the non-single-crystal laminate member $Q_i$ on the side of the electrode $E_i$ is P-type, the electrode $E_i$ may preferably be of a tin oxide or consisting principally thereof for the same reasons as given previously.

When the abovesaid non-single-crystal semiconductor layer is N-type, the electrode $E_i$ may preferably be a metal oxide layer formed of an indium oxide or consisting principally thereof.

In the case where the electrode $E_i$ has the two-layer structure comprised of the layers 4 and 5 and is light-transparent, if the non-single-crystal semiconductor layer of the non-single-crystal semiconductor laminate member $Q_i$ on the side of the electrode $E_i$ is P-type, it is preferable that the layer 5 be a metal oxide layer formed of a tin oxide or consisting principally thereof and the layer 4 a metal oxide layer formed of an indium oxide or consisting principally thereof.

When the electrode $F_i$ is light-transparent, the electrode $E_i$ need not always be reflective. In this case, if the electrode $E_i$ is single-layer, it may be a layer formed of chromium or consisting principally thereof. Moreover, in the case of the two-layer structure, the layer 4 may be the abovesaid metal oxide layer and the layer 5 may be layer formed of chromium or consisting principally thereof.

In the semiconductor element $U_i$ formed on the substrate 1, the non-single-crystal semiconductor laminate member $Q_{j+1}$ ($j=1, 2, \ldots (n-1)$) on the aforesaid electrode $E_{j+1}$ extends laterally from the marginal edge of the electrode $E_{j+1}$ on the opposite side from the electrode $E_j$ to a position on the electrode $E_j$ on the side of the electrode $E_{j+1}$ across the groove $G_j$ separating the electrode $E_j$ and $E_{j+1}$ making contact with the non-single crystal semiconductor laminate member $Q_j$.

The non-single-crystal semiconductor laminate member $Q_1$ formed on the electrode $E_1$ extends laterally onto the substrate 1 to cover the side surface of the electrode $E_1$ on the opposite side from the electrode $E_2$.

Further, laminate member $Q_n$ is formed as a non-single-crystal-semiconductor laminate member $Q_0$ to laterally extend onto the substrate 1 to cover the side surface of the electrode $E_n$ on the opposite side from the electrode $E_{n-1}$.

The non-single-crystal semiconductor laminate member $Q_i$ is formed to vertically extent to cover the electrode $E_i$. The non-single-crystal semiconductor laminate member $Q_i$ has cut therein a groove $O_i$ which is shown to extend in the vertical direction in FIG. 1. The grooves $O_1$ to $O_n$ are formed simultaneously.

The non-single-crystal semiconductor laminate member $Q_i$ formed on the electrode $E_i$ may be formed by one or more such two-layer structures, each composed of a P-type or N-type non-single-crystal semiconductor layer and another non-single-crystal semiconductor layer of the opposite conductivity type.

Accordingly, the non-single-crystal semiconductor laminate member $Q_i$ can be formed to have at least one PN junction.

Furthermore, the non-single-crystal semiconductor laminate member $Q_i$ may preferably be formed by one or more three-layer structures, each composed of a P-type or N-type non-single-crystal semiconductor layer 8, an I-type non-single-crystal semiconductor layer 9 and a non-single-crystal semiconductor layer 10 opposite in conductivity type to the layer 8 as shown in FIG. 3. Accordingly, the non-single-crystal semiconductor laminate member $Q_i$ may preferably be formed to have at least one PIN junction.

The non-single-crystal semiconductor layer of the non-single-crystal semiconductor laminate member $Q_i$ on the side of the electrode $E_i$ is P-type when the layer of the electrode $E_i$ making contact with the non-single-crystal semiconductor laminate member $Q_i$ is formed by a tin oxide or metallic oxide consisting principally of the tin oxide as described previously in respect of FIG. 3. When the layer 5 of the electrode $E_i$ making contact with the non-single-crystal semiconductor laminate member $Q_i$ is formed by an indium oxide or metallic oxide consisting principally of indium oxide, the non-single-crystal semiconductor layer of the non-single-crystal semiconductor laminate member $Q_i$ on the side of the electrode $E_i$ is N-type.

Accordingly, in the case where the non-single-crystal semiconductor laminate member $Q_i$ has the three-layer structure comprising the non-single-crystal semiconductor layers 8, 9 and 10 as illustrated in FIG. 3 and the layer of the electrode $E_i$ semiconductor laminate member $Q_i$ is formed by a tin oxide or metallic oxide consisting principally of tin oxide, the non-single-crystal semiconductor layers 8 and 10 are P-type and N-type, respectively. When the light transparent conductive layer 5 is formed by indium oxide or metal oxide consisting principally of indium oxide, the non-single-crystal semiconductor layers 8 and 10 are N-type and P-type, respectively.

The non-single-crystal semiconductor layers making up the non-single-crystal semiconductor laminate member $Q_i$ may preferable be formed of silicon or a semiconductor consisting principally of silicon but it may also be formed of other semiconductors.

When the non-single-crystal semiconductor laminate member $Q_i$ has the three-layer structure composed of the non-single-crystal semicodnuctor layers 8, 9 and 10, the non-single-crystal semiconductor layer 8 may be formed, for instance, of silicon to a thickness of 5 to 300 A, preferably 70 to 130 A. Where the non-single-crystal semiconductor layer 8 is P-type, for example, boron (B) may be introduced thereinto as a P-type impurity.

The non-single-crystal semiconductor layer 9 can be formed of silicon as is the case with the non-single-crystal semiconductor layer 8 but its thickness may preferably be larger than that of the layer 8, for instance, 0.4 to 0.7 $\mu$m. The non-single-crystal semiconductor layer 9 contains a very small amount of a P-type impurity or does not substantially contain either of P-type and N-type impurities and, if any, their concentrations are negligibly low.

The non-single-crystal semiconductor layer 10 can also be formed of silicon as is the case with the non-single-crystal semiconductor layer 8. But since the non-single-crystal semiconductor layer 10 is disposed on the side where the light to be converted is incident on the semiconductor element, it may preferably be formed of a semiconductor which has a larger energy band gap than does the semiconductor material of the non-single-crystal semiconductor layer 8, such as, for example, silicon carbide expressed by $Si_xC_{1-x}(0<x<1)$. In this case, the non-single-crystal semiconductor layer 10 can be formed to a thickness of 5 to 300 A, typically, in the range of 7 to 130 A.

Incidentally, the aforesaid non-single-crystal semiconductor laminate member $Q_0$ has the same structure as the aforementioned one $Q_i$.

In the semiconductor element $U_i$ formed on the substrate 1, the electrode $F_i$ on the non-single-crystal semiconductor laminate member $Q_i$ is disposed opposite to the electrode $E_i$ formed on the non-single-crystal semiconductor laminate member $Q_i$.

In this case, the electrode $F_{j+1}$ extends from a position apart from the isolated end portion of the non-single-crystal semiconductor laminate member $Q_{j+1}$ on the opposite side from the non-single-crystal semiconductor laminate member $Q_j$ onto its isolated end portion on the side of the non-single-crystal semiconductor laminate member $Q_{j+1}$.

The electrode $F_l$ extends from a position away from the isolated end portion of the non-single-crystal laminate member $Q_1$ on the side of the non-single-crystal semiconductor laminate member $Q_2$ to the marginal edge of the substrate 1 to cover the extension of the non-single-crystal laminate member $Q_1$ on the side surface of the electrode $E_1$.

On the non-single-crystal semiconductor laminate member $Q_n$, an electrode $F_0$ similar to the electrode $F_n$ is formed to extend from the isolated end portion on the side of the non-single-crystal semiconductor laminate member $Q_0$ to the marginal edge of the substrate 1 to cover the side surface of the non-single-crystal semiconductor laminate member $Q_0$.

The electrodes $F_j$ and $F_{j+1}$ are isolated by an isolating portion $H_j$. The electrodes $F_n$ and $F_0$ are also isolated portion $H_n$. The isolating portions $H_i$ may be simultaneously formed as grooves as is the case with the grooves $G_i$.

Figure 3D:
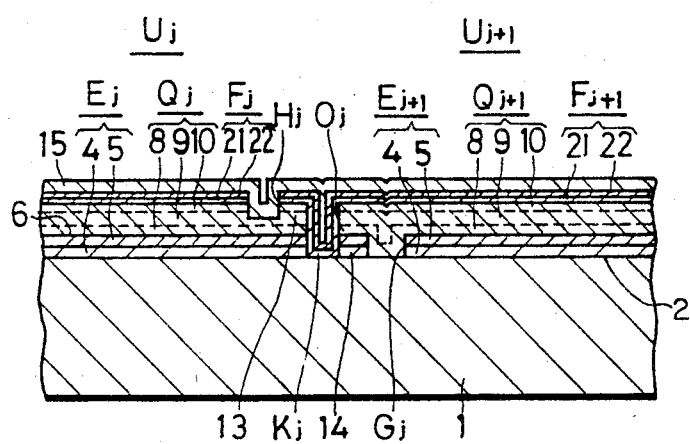

The electrode $F_i$ may be formed as a single layer as shown in FIG. 3 and may also be of the two-layer structure comprised of a layer 21 making contact with the non-single-crystal semiconductor laminate member $Q_i$ and a layer 22 formed on the layer 21 as illustrated in FIGS. 3B, 3D, and 7. Also it is possible to employ such a three-layer structure as depicted in FIG. 8 which comprises the layers 21 and 22 and another layer 23 formed on the layer 2.

The electrode $F_i$ may be a transparent conductive layer. When the electrode $F_i$ is a transparent single layer, it may be formed of a metallic oxide. In this case, it is required that the metal oxide be high in conductivity and in transmittance and, when forming the electrode $F_i$, would not react with the material or impurity of the non-single-crystal semiconductor layer of the non-single-crystal semiconductor laminate member $Q_i$ on the side of the electrode $F_i$ to form a layer which increases the contact resistance between the non-single-crystal semiconductor laminate member $Q_i$ and the electrode $F_i$ or a layer of low transmittance. To meet such requirements, when the non-single-crystal layer of the non-single-crystal semiconductor laminate member $Q_i$ on the side of the electrode $F_i$ is N-type, the electrode $F_i$ may preferably be formed of indium oxide or a metallic oxide consisting principally of indium oxide, such as, for example, indium oxide containing 1 to 10 wt% of tin oxide. When the non-single-crystal layer of the non-single-crystal semiconductor to laminate layer $Q_i$ on the side of the electrode $F_i$ is P-type, the electrode $F_i$ may preferably be formed of tin oxide or a metallic oxide consisting principally of tin oxide. The electrode $F_i$ can be formed, for instance, 300 to 600 Å thick.

In the case where the electrode $F_i$ is transparent and has the two-layer structure composed of the layers 21 and 22, the layer 21 making contact with the non-single-crystal semiconductor laminate member $Q_i$ may preferably be a layer formed of tin oxide or consisting principally thereof, or a layer formed of indium oxide or consisting principally thereof as described previously, depending on whether the non-single-crystal semiconductor layer of the non-single-crystal semiconductor laminate member $Q_i$ is P-type or N-type. In this case, it is preferable that when the layer 21 is formed of tin oxide or consisting principally thereof, layer 22 be formed of indium oxide or consisting principally thereof and, when layer 21 is formed of indium oxide or consisting principally thereof, layer 22 be formed of tin oxide or consisting principally thereof.

The electrode $F_i$ may be a reflective one when the substrate 1 and the electrode $E_i$ are light-transparent. When the electrode $F_i$ is the reflective electrode, it is possible to employ the two-layer structure comprising the layers 21 and 22, the three-layer structure comprising the layers 21, 22 and 23 or further multi-layer structure in addition to the single-layer structure as described previously.

Where the electrode $F_i$ is the two-layer structure made up of the layers 21 and 22, it is preferred that depending on whether the non-single-crystal semiconductor layer of the non-single-crystal semiconductor laminate member $Q_i$ contacting the layer 21 is P-type or N-type, the layer 21 be formed of tin oxide or consisting principally thereof or formed of indium oxide or consisting principally thereof and the layer 22 be a reflective conductive layer as of silver or aluminum, as described previously.

When the electrode $F_i$ has the three-layer structure composed of the layers 21, 22 and 23, it is preferable that the layers 21 and 22 be such layers as mentioned above and the layer 23 a nickel layer.

The electrode $F_i$ need not always be reflective even if the substrate 1 and the electrode $E_i$ are light-transparent. In such a case, if the electrode has the two-layer structure comprised of the layers 21 and 22, it is preferred that the layer 21 be such a layer as mentioned above and the layer 22 a sublimable conductive layer formed of chrominum or consisting principally thereof.

The electrode $F_0$ formed to extend on the non-single-crystal semiconductor laminate member $Q_0$ has the same structure as the abovesaid electrode $F_i$.

The electrode $F_{j+1}$ of the semiconductor element $U_{j+1}$ ($j=1, 2, \ldots (n-1)$) is coupled with the electrode $E_j$ of the semiconductor element $U_j$ through a coupling portion $K_j$.

The coupling portion $K_j$ extends from the position where the electrode $F_{j+1}$ is opposite to the electrode $E_j$ to the region of the electrode $E_j$ opposite to the electrode $F_{j+1}$, passing through a groove $O_j$ by which the non-single-crystal semiconductor laminate members $Q_j$ and $Q_{j+1}$ are separated. Such a coupling portion $K_j$ is formed by an extension of the electrode $F_{j+1}$ formed simultaneously with the electrode $F_{j+1}$.

The electrode $F_1$ of the semiconductor element $U_1$ extends down to the surface of the substrate 1 as referred to previously and extension constitutes an external connection terminal 11.

The electrode $F_0$ extending on the non-single-crystal semiconductor laminate member $Q_0$ is coupled with the electrode $E_n$ of the semiconductor element $U_n$ through a coupling portion $K_n$. In this case, the coupling portion $K_n$ extends from the position where the electrode $F_0$ is opposite to the electrode $E_n$ to the region of the electrode $E_n$ opposite to the electrode $F_0$, passing through a groove $O_n$. Such a coupling portion $K_n$ is an extension of the electrode $F_0$ formed simultaneously therewith. The electrode $F_0$ extends on the side surface of the non-single-crystal semiconductor laminate member $Q_0$ in the direction reverse from the electrode $F_n$ to the marginal edge of the substrate 1, and the extending end portion forms a terminal 12 for external connection.

The isolated portion $H_j$ is formed to extend in the vertical direction in FIG. 1 to go down into the non-single-crystal semiconductor laminate member $Q_j$ to form therein a region 13 underlying the electrode $E_{j+1}$. The groove $O_j$ also extends across that portion of the electrode $E_j$ adjacent to the electrode $E_{j+1}$ in the thickwise direction. Accordingly, the electrode $E_j$ has an isolated portion 14 on the side of the electrode $E_{j+1}$.

The isolated portion $H_n$ formed to extend in the vertical direction in FIG. 1 to go down into the non-single-crystal semiconductor laminate member $Q_n$ to form therein the region 13 underlying the electrode $F_0$.

The groove $O_n$ extends across that portion of the electrode $E_n$ opposite side from the electrode $F_0$ in the thickwise direction. Accordingly, the electrode $E_n$ has the isolated region 14 on the opposite side from the electrode $E_{n-1}$.

On the substrate 1 is formed a transparent antireflection and protective film 15 to cover the aforesaid semiconductors elements $U_1$ to $U_n$. In this case, however, the antireflection and protective film 15 does not extend on the extended portions of the electrodes $F_1$ and $F_0$ forming the aforementioned external connection terminals 11 and 12, respectively.

The foregoing is a description of the arrangement of an embodiment of the photoelectric conversion device according to the present invention.

Next, a description will be given, with reference to FIGS. 5A to G, of an embodiment of the photoelectric conversion device manufacturing method of the present invention.

In FIGS. 5A to G, parts corresponding to those in FIGS. 1 and 2 are identified by the same reference numerals and characters and no detailed description thereof will be repeated.

The manufacturing method of the photoelectric conversion device shown in FIGS. 5A to G is as follows:

The manufacture starts with the preparation of such a substrate 1 as described previously with respect to FIGS. 1 and 2.

Then, as shown in FIG. 5B, the conductive layer 41 which will ultimately form the electrodes $E_1$ to $E_n$ described previously in connection with FIGS. 1 and 2 is formed by a known method on the substrate 1.

Figure 5C:
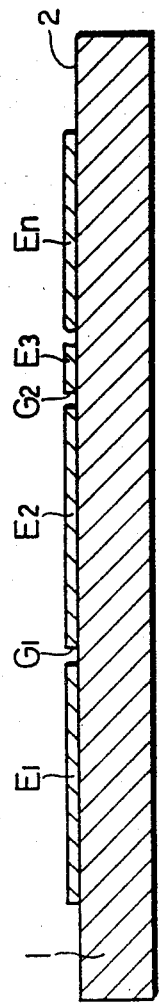

In the case where the electrodes $E_1$ to $E_n$ are each formed to have the two-layer structure composed of the two layers 4 and 5 as described previously with regard to FIG. 3, the conductive layer 41 is made up of a layer which will ultimately serve as the layer 4 and another layer which ultimately serve as the layer 5, though neither shown nor described in detail. The former layer is first formed on the substrate 1 by a known method, for example, vapor deposition and then the latter layer is similarly formed thereon by a known method, for instance, vapor deposition. Next, the conductive layer 41 is scanned by a laser beam (not shown) having a diameter of 30 to 70 $\mu$m, typically, 40 $\mu$m, by which the aforementioned $(n-1)$ grooves $G_i$ to $G_{n-1}$ are cut in the conductive layer 41 to form n electrodes $E_1$ to $E_n$ which are separated from adjacent ones of them by the grooves $G_1$ to $G_{n-1}$, as shown in FIG. 5C. For this scanning, it is possible to employ a laser beam of a 1.06 $\mu$m wavelength from a YAG laser and a laser beam of a 0.488 or 0.512 $\mu$m wavelength from an argon laser.

The abovesaid laser beam scanning can be carried out in the air but may also be performed in the atmosphere of a gas which reacts with the conductive material of the layer 41 at high temperatures to sputter it from the substrate surface. In this case, the gas used may be hydrogen fluride (HF), hydrogen chloride (HCl) Freon gas, $CF_4$, $CHF_3$, $CClF_3$ or like gases. In the case where the laser beam scanning takes place in the air, burrs are likely to form on the upper marginal edges of the groove $G_j$. Accordingly, it is desirable that the laser beam scanning be followed by deburring through the use of the abovesaid gas or etching with an etchant such as hydrofluoric acid (HF), hydrochloric acid (HCl) Freon liquids, $C_2F_3CL_4$, $C_2F_3Cl_3$ or similar liquids. Moreover, it is possible to accomplish the laser beam scanning of the conductive layer 41 easily and accurately by the aid of a computer while monitoring through a video camera device.

Figure 5D:
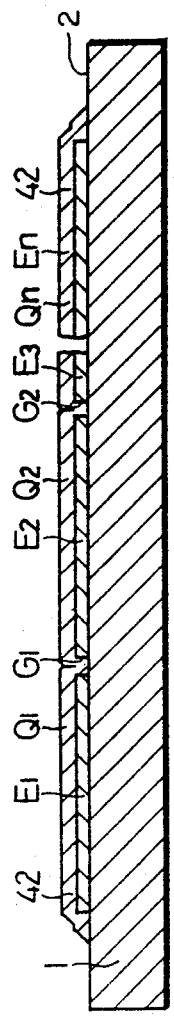

Next, a non-single-crystal semiconductor layer formed by a known method, for example, low-pressure CVD on the substrate 1 to fill the grooves $G_1$ to $G_{n-1}$ and to cover the electrode $E_1$ to $E_n$ as shown in FIG. 5D so that the regions of the layer 42 on the electrodes $E_1$ to $E_n$ may be the non-single-crystal semiconductor laminate member $Q_1$ to $Q_n$ described previously in respect of FIGS. 1 and 2.

Where the non-single-crystal semiconductor laminate members $Q_1$ to $Q_n$ are each formed as the three-layer structure consisting of the non-single-crystal semiconductor layers 8, 9 and 10 as described previously with regard to FIG. 3, non-single-crystal semiconductor layers which will ultimately be used as the non-single-crystal layers 8, 9 and 10 respectively, are formed in this order through the use of a known method, for instance, the low-pressure CVD method, thereby providing the non-single-crystal semiconductor laminate member 42.

Figure 5E:
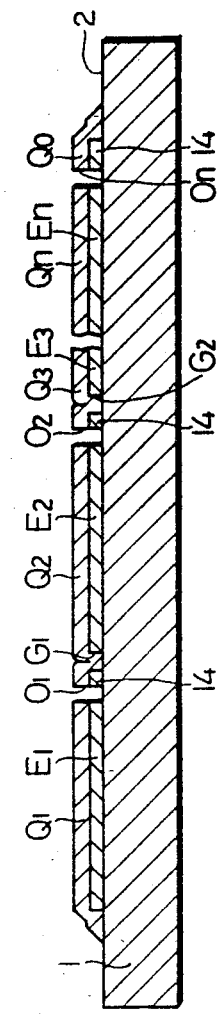

After this, the non-single-crystal semiconductor laminate members $Q_1$ to $Q_n$ are selectively removed by laser beam scanning to cut therein the aforementioned n grooves $O_1$ to $O_n$ as shown in FIG. 5E. In this case, the groove $O_i (I=1, 2, \ldots n)$ can be formed to extend down to the insulating film 2 of the substrate 1 across the electrode $E_i$ as illustrated. In such a case, the region 14 of the electrode $E_i$ is isolated from the other regions. The laser beam scanning of the non-single-crystal semiconductor laminate members $Q_1$ to $Q_n$ can take place in the air as is the case with the conductive layer 41. It is also possible to carry out the laser beam scanning in the atmosphere of a gas which reacts with the materials of the non-single-crystal semiconductor laminate member 42 and the electrodes $E_1$ to $E_n$ at high temperatures to sputter them from the substrate surface. Also in this case, the gas used is of the aforesaid gases. In the case where the laser beam scanning of the non-single-crystal semiconductor laminate members $Q_1$ to $Q_n$ is carried out in the air, it is desirable that the laser beam scanning be followed by deburring through the use of the aforesaid gas or etching with such etchants as mentioned previously. The abovesaid laser beam scanning can also be performed easily and accurately by the aid of a computer while monitoring through the video camera device.

The groove $O_j$ ($j=1, 2, \ldots (n-1)$) is formed at a position spaced a predetermined distance apart from the groove $G_j$ laterally thereof (on the left thereof in FIG. 5). The abovesaid predetermined distance is large as compared with the thickness of the non-single-crystal semiconductor laminate member 42. It is preferable, however, to minimize this distance. By the aid of a computer the groove $O_j$ can be provided in close proximity to the groove $G_j$ with high accuracy. This permits reduction of the area of the substrate 1 occupied by the region 14 of the electrode $E_j$. It is desirable that the groove $O_n$ be formed closely to the marginal edge of the electrode $E_n$ on the opposite side from the electrode $E_{n-1}$ so that the region 14 of the electrode $E_n$ may occupy minimum area of the substrate.

Next, a conductive layer 43, which will ultimately form the electrodes $F_1$ to $F_n$ and $F_0$ referred to in respect to FIGS. 1 and 2, is formed, for example, by vapor deposition on the substrate 1 to cover the non-single-crystal semiconductor liminate members $Q_1$ to $Q_n$ and to fill the grooves $O_1$ to $O_n$, forming coupling portions $K_1$ to $K_n$. In this case, the conductive layer 43 is formed to extend on the substrate 1 except for both marginal portions in its widthwise direction but it covers both marginal portions of the substrate 1 in its lengthwise direction.

Next, the conductive layer 43 is selectively removed by laser beam scanning as is the case with the non-single-crystal semiconductor laminate members $Q_1$ to $Q_n$. By this laser beam scanning there are formed in the conductive layer 43 n isolating portions $H_1$ to $H_n$, n electrodes $F_1$ to $F_n$ separated by the isolating portions $H_1$ to $H_{n-1}$, respectively, and opposite to the electrodes $E_1$ to $E_n$ across the non-single-crystal semiconductor laminate members $Q_1$ to $Q_n$, respectively, and an electrode $F_0$ isolated by the isolating portion $H_n$ from the electrode $F_n$ and opposite to electrode $E_n$. In this case, the laser beam scanning is carried out so tht the electrode $F_{j+1}$ may be linked with the electrode $E_j$ through the coupling portion $K_j$ and so that the electrode $F_0$ may be linked with the electrode $E_n$ through the coupling portion $K_n$.

By the abovesaid laser beam scanning, the isolating portion $H_i$ ($i=1, 2, \ldots n$) can be formed to extend into the non-single-crystal semiconductor laminate member $Q_i$.

As is the case with the conductive layer 41, the laser beam scanning of the conductive layer 43 can be effected in the air and may also be carried out in the atmosphere of a gas which reacts with the materials of the conductive layer 43 and the non-single-crystal semiconductor laminate members $Q_1$ to $Q_n$ at high temperatures to sputter them from the substrate surface. The gas used in this case may be the aforesaid gases.

Also in the case of performing the laser beam scanning of the conductive layer 43 in the air, it is desirable that the laser beam scanning be followed by deburring through the use of the aforesaid gas or etching using the aforesaid liquid as the etchant.

By the laser beam scanning for the conductive layer 43, the isolating portion $H_1$ can be provided in the form of a groove as illustrated.

The laser beam scanning of the conductive layer 43 can also be carried out easily and accurately by the aid of a computer while monitoring through a video camera device.

Further, the isolating portion $H_i$ is formed a predetermined distance apart from the groove $O_i$ laterally thereof (on the left thereof in the drawing). The abovesaid predetermined distance is large as compared with the thickness of the non-single-crystal semiconductor laminate member 43, but it may preferably be selected as small as possible. By the aid of a computer, the isolating portion $H_i$ can be formed in close proximity to the groove $O_i$ with high precision. This allows reduction of the area of the substrate 1 occupied by the region 13 formed in the non-single-crystal semiconductor laminate member $Q_i$.

Next, a transparent antireflection and protective film 15 is formed by a known method on the substrate to cover the electrodes $F_1$ to $F_n$ and $F_0$ and the isolating portion $H_1$ to $H_n$ as shown in FIG. 2.

In the manner described above, the photoelectric conversion device of the present invention, shown in FIGS. 1 and 2, is manufactured.

The above description of an embodiment of the present invention and an example of its manufacturing method.

According to the photoelectric conversion device of FIGS. 1 and 2, when light (not shown) is incident thereon from the side of the substrate 1 or the electrodes $F_1$ to $F_n$ each semiconductor element $U_i$ ($i=1, 2, \ldots n$) carries out photoelectric conversion to generate photovoltage across its electrodes $E_i$ and $F_i$.

The electrode $F_{j+1}$ ($j=1, 2, \ldots (n-1)$) of the semiconductor element $U_{j+1}$ is linked with the electrode $E_j$ of the semiconductor element $U_j$ through the coupling portion $K_j$ and the electrode $F_1$ of the semiconductor element $U_1$ is connected to an external connection terminal 11 and the electrode $E_n$ of the semiconductor element $U_n$ is connected to an external connection terminal 12 through the coupling portion $K_n$ and the electrode $F_0$.

Accordingly, the semiconductor elements $U_1$ to $U_n$ are sequentially connected in series through the coupling portions $K_1$ to $K_{n-1}$ and connected to the external connection terminals 11 and 12. Consequently, upon incidence of light, there is developed across the external connection terminals 11 and 12 the photovoltage that is equal to the sum of voltages produced by the semiconductor elements $U_1$ to $U_n$.

In addition, by forming the electrodes $E_i$ to $F_i$ of the semiconductor element $U_i$ as the reflective electrodes as described previously with respect to FIG. 3, incident light can efficiently be utilized by the semiconductor element $U_i$, providing for increased photovoltage per unit area of the substrate 1.

Besides, in the case where the layer of the electrode $E_i$ contacting the non-single-crystal semiconductor laminate member $Q_i$ is formed as the aforesaid metal oxide layer, an excellent ohmic contact can be made between the electrode $E_i$ and the non-single-crystal semiconductor laminate member $Q_i$, so that high photovoltage can be obtained from the semiconductor element $U_i$ with practically no loss.

These features can be made more marked if the layer of the electrode $E_i$ contacting the non-single-crystal semiconductor laminate member $Q_i$ is formed of tin oxide of a metallic oxide consisting principally thereof, or indium oxide or a metallic oxide consisting principally thereof, depending on whether the non-single-crystal semiconductor layer of the non-single-crystal semiconductor laminate member $Q_i$ contacting the electrode $E_i$ is P-type of N-type.

Where the groove $O_j$ cut in the non-single-crystal semiconductor laminate member $Q_j$ is extended into the electrode $E_j$ as illustrated, the coupling portion $K_j$ extending from the electrode $F_{j+1}$ makes side-contact with the electrode $E_j$ and hence makes good ohmic contact therewith, ensuring the obtainment of large electromotive force across the external connection terminals 11 and 12 with no appreciable loss. This is more marked when the coupling portion $K_j$ and the electrode $E_j$ are linked with each other through their metal oxide layers.

Since the isolating portion $H_j$ is formed to extend into the non-single-crystal semiconductor laminate member $Q_j$ as illustrated, substantially no leakage occurs through the non-single-crystal semiconductor laminate members $Q_j$ between the electrode $E_j$ and $F_{j+1}$, ensuring the obtainment of large electromotive force across the external connection terminals 11 and 12.

In the embodiment of FIGS. 1 and 2, the non-single-crystal semiconductor laminate member $Q_1$ of the semiconductor element $U_1$ is formed on the electrode $E_1$ to extend onto the substrate 1 on the side surface of the electrode $E_1$ on the opposite side from the non-single-crystal semiconductor laminate member $Q_2$, and the electrode $F_1$ is formed on the non-single-crystal semiconductor laminate member $Q_1$ to extend onto the substrate 1 on the side surface and the extended portion is used as the external connection terminal 11. With such an arrangement, the series circuit of the semiconductor elements $U_1$ to $U_n$ can easily be connected at one end to the external connection terminal 11. This permits simplification of the construction of photoelectric conversion device as a whole.

Further, in the embodiment of FIGS. 1 and 2, the non-single-crystal semiconductor laminate member $Q_n$ is formed to extend on the side surface of the electrode $E_n$ on the opposite side from the electrode $E_{n-1}$ towards the substrate 1. The electrode $F_0$ is formed on the non-single-crystal semiconductor laminate member $Q_n$ to extend to the substrate surface and the electrode $F_0$ is coupled with the electrode $E_n$ through the coupling portion $K_n$. And the extended portion of the electrode $F_0$ on the substrate 1 is used as the external connection terminal 12. Accordingly, the series circuit of the semiconductor elements $U_1$ to $U_n$ can easily be connected at one end to the external connection terminal 12, permitting simplification of the overall structure of the photoelectric conversion device.

A description will now be given of other embodiments of the photoelectric conversion device of the present invention.

In the embodiment of the photoelectric conversion device of the present invention depicted in FIGS. 1 to 3, the groove $O_j$ extends completely through the electrode $E_j$ to reach the substrate 1, and the coupling portion $K_j$ makes contact only with the side of the electrode $E_j$ exposed by the groove $O_j$.

Figure 6A:
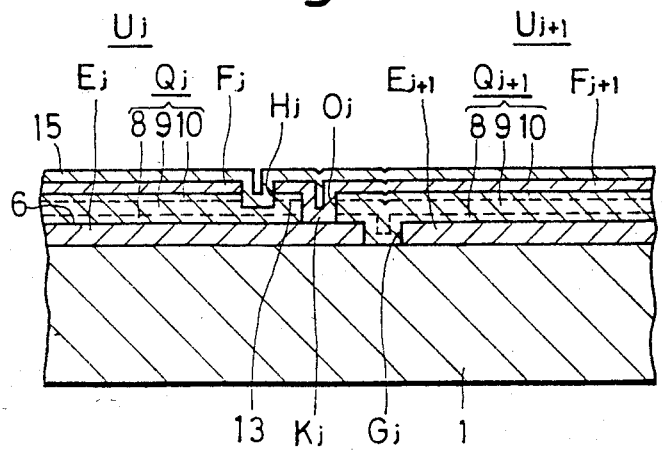

In other embodiment of the photoelectric conversion device of the present invention, however, as shown in FIG. 6A, the groove $O_j$ is not extended into the electrode $E_j$ and the coupling portion $K_j$ is formed to make contact only with the top of the electrode $E_j$ exposed by the groove $O_j$.

Further, as shown in FIG. 6B, the width of the groove $O_j$ in the electrode $E_j$ is made smaller than in the non-single-crystal semiconductor laminate member $Q_j$ and the coupling portion $K_j$ is formed to make contact with the top and side of the electrode $E_j$ exposed by the groove $O_j$.

Moreover, according to another embodiment, as shown in FIG. 6C, the groove $O_j$ is extended into the substrate 1 with a greater width than in the electrode $E_j$, and the coupling portion $K_j$ is formed to make contact with the side and bottom of the electrode $E_j$ exposed by the groove $O_j$.

According to another embodiment, as shown in FIG. 6D, the groove $O_j$ is extended across the electrode $E_j$ as in the case of FIG. 6B and into the substrate 1 as in the case of FIG. 6C, and the coupling portion $K_j$ is formed to make contact with the top, side and bottom of the electrode $E_j$ exposed by the groove $O_j$.

In the embodiments illustrated in FIGS. 6A to D, the groove $O_j$ can easily be formed by the same laser beam scanning as that for the non-single-crystal semiconductor laminate member $Q_j$ described previously with respect to FIG. 5 but, in this case, the intensity of the laser beam is adjusted suitably.

It will be seen that any of the structures of the embodiments provided with the grooves shown in FIGS. 6A to D possesses the same advantages as are obtainable with the embodiment of FIGS. 1 to 3, though not described in detail.

In the embodiment of the photoelectric conversion device shown in FIGS. 1 to 3, the electrodes $F_j$ and $F_{j+1}$ of the semiconductor elements $U_j$ and $U_{j+1}$ are isolated by the isolating portion $H_j$ provided in the form of a groove and the isolating portion $H_j$ extends into the non-single-crystal semiconductor laminate member $Q_j$. The embodiment of FIG. 7B corresponding to FIG. 3 is identical in construction with the embodiment of FIGS. 1 to 3 except that the isolating portion $H_j$ extends completely through the non-single-crystal semiconductor laminate member $Q_j$. Such isolating portions $H_1$ to $H_n$ can easily be formed by adjusting the scanning speed and/or power of the laser beam in the laser beam scanning for the conductive layer 43 described previously in connection with FIG. 5.

Figure 7A:
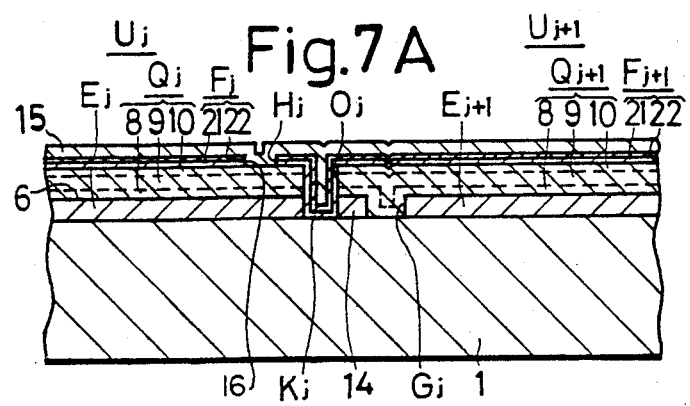
Figure 7B:
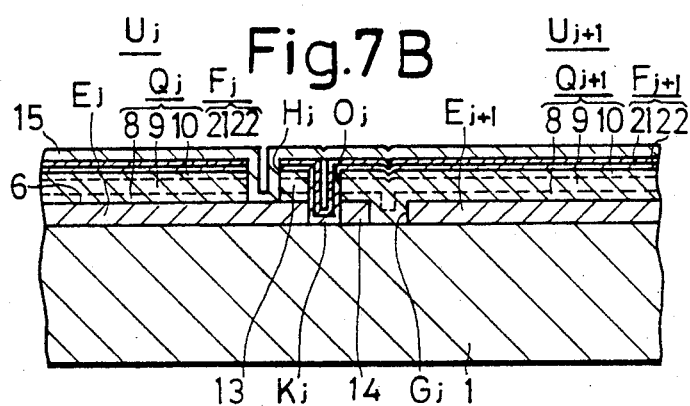
Figure 7C:
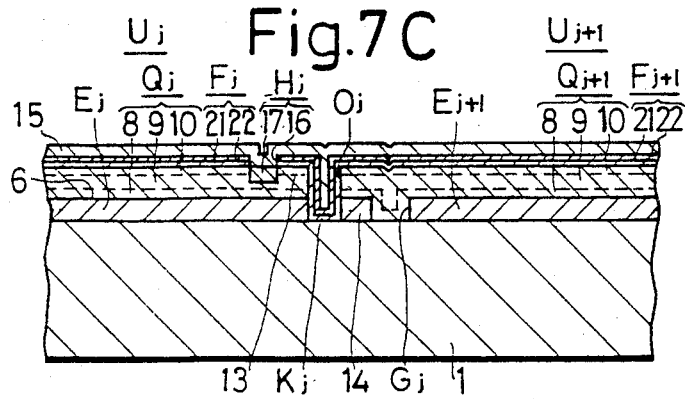

Further, the embodiment of FIG. 7C corresponding to the FIG. 3 photoelectric conversion device of the present invention is identical in construction to the embodiment of FIGS. 1 to 3 except that the isolating portion $H_j$ consists of the groove 16 defined between the electrodes $F_j$ and $F_{j+1}$ and the oxide 17 of the non-single-crystal semiconductor forming the non-single-crystal semiconductor laminate member $Q_j$, which is formed in the upper half portion thereof.

Such isolating portions $H_1$ to $H_n$ can easily be formed by carrying out in an oxygen atmosphere the laser beam scanning for the conductive layer 43 described previously with respect to FIG. 5.

Likewise, the embodiment of FIG. 7D is identical in construction to the embodiment of FIGS. 1 to 3 except that the isolating portion $H_j$ is formed by an oxide 18 which results from oxidation of the conductive material forming the electrodes $F_j$ and $F_{j+1}$ and separates them as shown. Such isolating portions $H_1$ to $H_n$ can easily be formed by the same laser beam scanning as that employed for the third embodiment of FIG. 7C.

The embodiment of FIG. 7A is also identical in construction to the embodiment of FIGS. 1 to 3 except that the isolating portion $H_j$ is formed by the groove 16 which barely extends into the non-single-crystal semiconductor laminate member $Q_j$ but separates the electrodes $E_j$ and $E_{j+1}$ as shown. Such isolating portion $H_1$ to $H_n$ can easily be formed by adjusting the scanning speed and/or power of the laser beam in the laser beam scanning as in the embodiment of FIG. 5.

The embodiment of FIG. 7E is identical in construction to the embodiment of FIGS. 1 to 3 except that the isolating portion $H_j$ has such a structure that an oxide layer is formed on the interior surface of the groove described previously with respect to FIG. 3.

Such an isolating portion $H_j$ can easily be formed by performing the laser beam scanning for the conductive layer 43 mentioned previously with regard to FIG. 5 in an oxygen atmosphere as in the embodiment of FIG. 7D.

It is evident that all the arrangements of the embodiments having the isolating portions $H_1$ to $H_n$, shown in FIGS. 7A to E, have the same features as those of the embodiment of FIGS. 1 to 3, though not described in detail.

In the embodiment of FIGS. 1 to 3, the series circuit of the semiconductor elements $U_1$ to $U_n$ constituting one photoelectric conversion device on the substrate 1 is connected at one end to the external connection terminal 11, which is formed by the extended portion of the electrode $E_1$ of the semiconductor element $U_1$ on the substrate 1, and connected at the other end to the external connection terminal 12 which is formed by the extended portion of the electrode $F_0$ on the substrate 1 and connected to the electrode $E_n$ through the coupling portion $K_n$.

Figure 9:
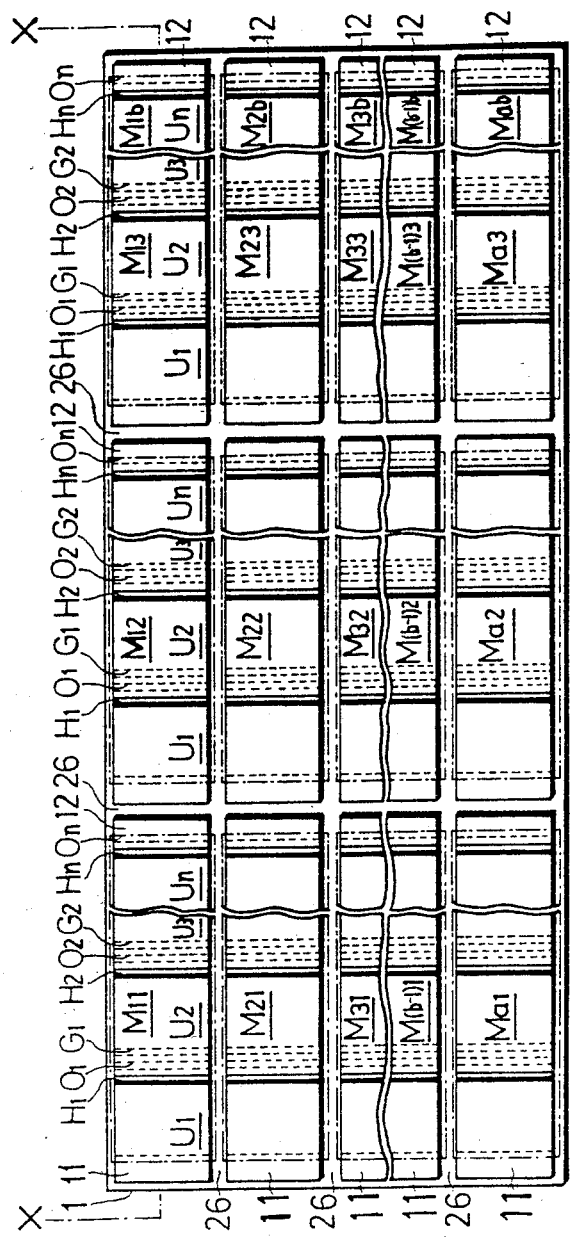
FIG. 9 is a plan view schematically illustrating another embodiment of the present invention.

In another embodiment of the present invention, however, a plurality $a \times b$ of such photoelectric conversion devices, each made up of the n semiconductor elements $U_1$ to $U_n$ connected in series as shown in FIGS. 1 and 2, are arranged in the form of a matrix consisting of a rows and b columns as illustrated in FIGS. 9 and 10 corresponding to FIGS. 1 and 2. In FIGS. 9 and 10 reference character $M_{rs}$ (r=1, 2, ... a and s=1, 2, ... b) indicates each photoelectric conversion device disposed at one of the intersections of rows and columns. The photoelectric conversion devices $M_{11}$ to $M_{1b}$, $M_{21}$ to $M_{2b}$, ... and $M_{a1}$ to $M_{ab}$ are isolated by grooves 26 between adjacent devices.

Figure 11A:
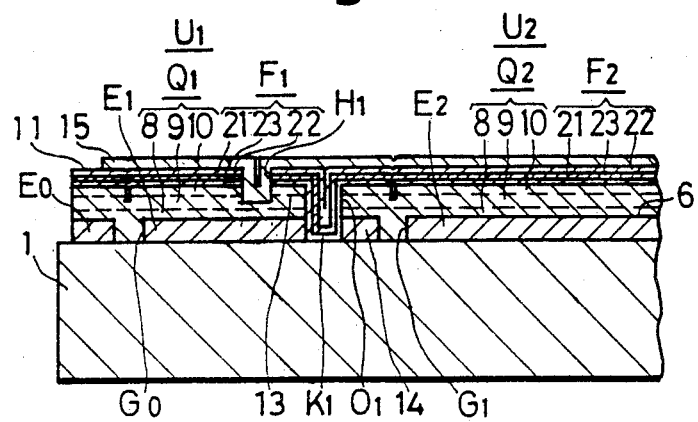
FIGS. 11A and B are enlarged cross-sectional views showing a part of the photoelectric conversion device of the present invention illustrated in FIGS. 9 and 10.

In the embodiment illustrated in FIGS. 9 and 10, the photoelectric conversion device $M_{rs}$ is identical in construction with the photoelectric conversion device of the embodiment of FIGS. 1 to 3 except in the following points:

As shown in FIG. 11A, an electrode $E_0$ similar to the electrodes $E_1$ to $E_n$ is formed on the substrate 1 but spaced from the electrode $E_1$ by a groove $G_0$ similar to those $G_1$ to $G_{n-1}$.

Further, the non-single-crystal semiconductor laminate member $Q_1$ of the semiconductor element $U_1$ extends across the groove $G_0$ to the marginal edge of the electrode $E_0$.

The electrode $F_1$ of the semiconductor element $U_1$, which is formed to cover the non-single-crystal semiconductor laminate member $Q_1$ and extend to the substrate 1 in the first embodiment, is formed to extend only to the marginal edge of the corresponding non-single-crystal semiconductor laminate member $Q_1$. And the external connection terminal 11 is formed by the end portion of the electrode $F_1$ on the non-single-crystal semiconductor laminate member $Q_1$ on the opposite side from the electrode $F_2$.

Figure 11B:
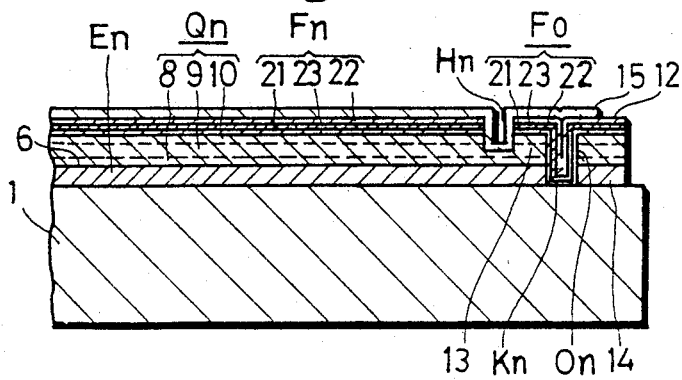
Figure 12C:
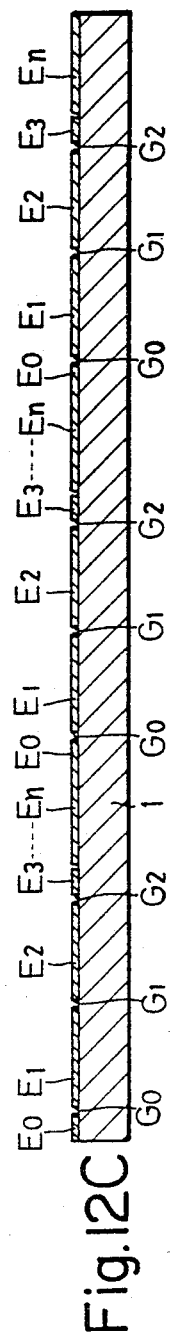
Figure 12D:
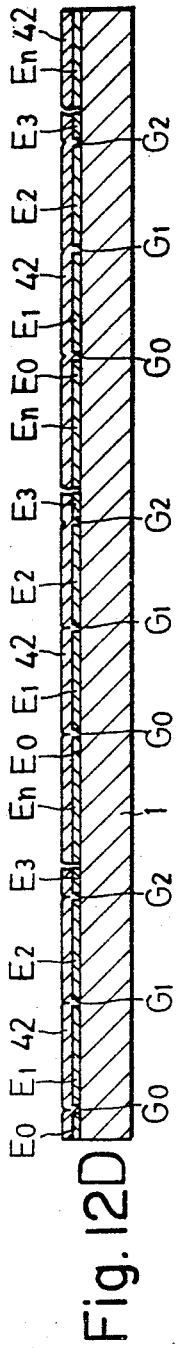
Figure 12E:
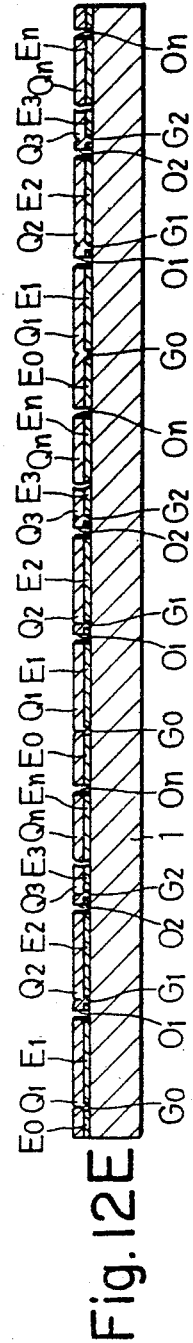

Moreover, as shown in FIG. 11B, the non-single-crystal semiconductor laminate member $Q_n$ of the semiconductor element $U_n$ is formed to extend to the marginal edge of the electrode $E_n$.

The electrode $F_0$, though formed to cover the non-single-crystal semiconductor laminate member $Q_n$ and to extend to the substrate 1 in the embodiment of FIGS. 1 to 3, extends to the marginal edge of the corresponding non-single crystal semiconductor laminate member $Q_n$. And the external connection terminal 12 is formed by the end portioon of the electrode $F_0$ on the non-single-crystal semiconductor laminate member $Q_n$ on the opposite side from the electrode $F_n$.

The above is a description of the abovesaid another embodiment of the photoelectric conversion device of the present invention.

The photoelectric conversion device of such a construction can be obtained by a manufacturing method similar to that employed for the fabrication of the photoelectric conversion device of the embodiment of FIGS. 1 to 3.

Figure 4A:
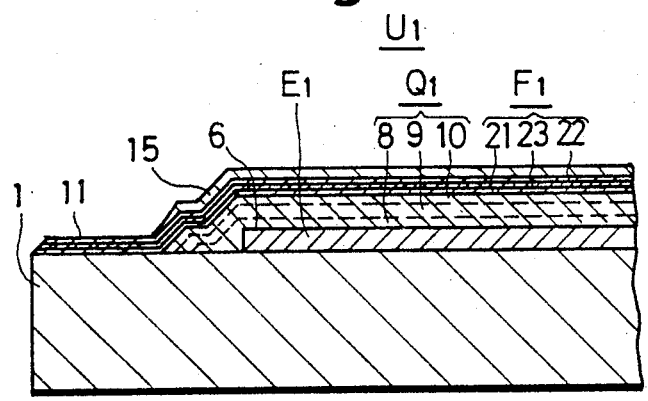
FIGS. 4A and B are detailed sectional views showing on an enlarged scale other parts of the embodiment of FIG. 1.
Figure 4B:
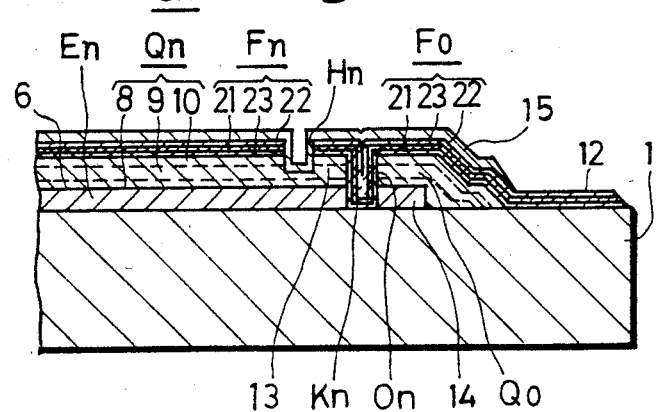

That is, as shown in FIGS. 12A to G corresponding to FIGS. 5A to G, $a \times b$ photoelectric conversion devices $M_{11}$ to $M_{1b}$, $M_{21}$ to $M_{2b}$, ... and $M_{a1}$ to $M_{ab}$ are formed on the substrate 1 by a sequence of steps similar to those shown in FIGS. 5A to G, though not described in detail. Next, as shown in FIG. 12H, the grooves 26 are formed by the same laser beam scanning as described previously in respect to FIG. 4.

Next, the light transparent antireflection and protective film 15 (not shown) is formed.

In this way, the structure of the embodiment referred to previously in conjunction with FIGS. 9 and 10 is obtained.

The above is a description of the abovesaid another embodiment and its manufacturing method.

The photoelectric conversion device of FIGS. 9 and 10 is identical in construction to the embodiment of FIGS. 1 to 3 except in the abovesaid points, and hence presents the same advantages as those obtainable with the embodiment of FIGS. 1 to 4, though not described in detail.

Moreover, according to the embodiment of FIGS. 9 and 10, the photoelectric conversion devices $M_{11}$ to $M_{1b}$, $M_{21}$ to $M_{2b}$, ... and $M_{a1}$ to $M_{ab}$ are formed on the substrate 1 and separated by the grooves 26. If the substrate 1 is formed of a flexible, insulating sheet-like member, it can easily be severed at the positions of the grooves 26 into $a \times b$ independent photoelectric conversion devices.

Incidentally, the embodiment of FIGS. 9 and 10 can also be modified and varied in the same manner as in the second to ninth embodiments of FIGS. 6 to 8 which are modifications and variations of the embodiment of FIGS. 1 to 4.

While the foregoing embodiments of the present invention the groove $O_j$ formed in each of the non-single-crystal semiconductor laminate members $Q_j$ is shown to be a groove which continuously extends in the vertical direction to completely isolate the non-single-crystal semiconductor laminate members $Q_j$ and $Q_{j+1}$ mechanically, the groove $O_j$ may also be formed to discontinuously extend in the vertical direction so that the non-single-crystal semiconductor laminate members $Q_j$ and $Q_{j+1}$ may not completely be isolated by the groove $O_j$ from each other.

It will be apparent that may modifications and variations may be effected without departing from the scope of the novel concepts of the present invention.

What is claimed is:

1. A photoelectric conversion device comprising:
   a substrate having an insulating surface; and
   a plurality n (n being an integer larger than one) of semiconductor elements $U_1$ to $U_n$ sequentially formed thereon side by side and connected in series one after another:
   wherein the semiconductor element $U_i$ (i=1, 2, 3, ... n) has a first electrode $E_i$ formed on the substrate, a non-single-crystal semiconductor laminate member $Q_i$ formed on the first electrode $E_i$ and having formed therein at least one semiconductor junction, and a second electrode $F_i$ formed on the non-single-crystal semiconductor laminate member $Q_i$ in opposing relation to the first electrode $E_i$;
   wherein the first electrodes $E_j$ and $E_{j+1}$ (j=1, 2, ... (n−1) are separated by a first groove $G_j$;
   wherein the second electrode $F_{j+1}$ of the semiconductor element $U_{j+1}$ is coupled with the first electrode $E_j$ of the semiconductor element $U_j$ through a coupling portion $K_j$ formed by an extension of the second electrode $F_{j+1}$ and extending into a second groove $O_j$ formed in the non-single-crystal semiconductor laminate member $Q_j$ and spaced from the first groove $G_j$; and
   wherein the second electrodes $F_j$ and $F_{j+1}$ are separated by an isolating portion $H_j$, the isolating portion $H_j$ comprising a third groove opposite the first electrode $E_j$ but spaced from the second groove $O_j$ and extending to the semiconductor laminate member $Q_j$, and an oxidized portion of the non-single-crystal semiconductor laminate member $Q_j$ which forms the lower surface of the third groove.

2. A device as in claim 1 wherein the second electrode $F_i$ is formed by a layered member having a light transparent layer making contact with the non-single-crystal semiconductor laminate member $Q_i$ and a conductive material layer formed on the light transparent layer.

3. A photoelectric conversion device according to claim 2, wherein the light transparent layer of the second electrode $F_i$ is a layer formed of conductive metal oxide.

4. A photoelectric conversion device according to claim 2, wherein the non-single-crystal semiconductor laminate member $Q_i$ has an N type non-single-crystal semiconductor layer making contact with the second electrode $F_i$, and wherein the light transparent layer of the second electrode $F_i$ is a layer formed of indium oxide or principally thereof.

5. A photoelectric conversion device according to claim 2, wherein the non-single-crystal semiconductor laminate member $Q_i$ has a P type non-single-crystal semiconductor layer making contact with the second electrode $F_i$, and wherein the light transparent layer of the second electrode $F_i$ is a layer formed of tin oxide or consisting principally thereof.

6. A photoelectric conversion device according to claim 2, wherein the first electrode $E_i$ is formed of a light transparent layer making contact with the non-single-crystal semiconductor laminate member $Q_i$, wherein the second groove $O_j$ is cut in the non-single-crystal semiconductor laminate member $Q_j$ between the second electrode $F_{j+1}$ and the first electrode $E_j$ to extend into the first electrode $E_j$ and wherein the transparent layer of the coupling portion $K_j$ is coupled with the transparent layer of the first electrode $E_j$.

7. A photoelectric conversion device according to claim 6, wherein the light transparent layer of the first electrode $E_i$ is a layer formed of conductive metal oxide.

8. A photoelectric conversion device according to claim 1, wherein the second electrodes $F_j$ and $F_{j+1}$ and isolating portion $H_j$ are continuously covered with an insulating layer.

9. A photoelectric conversion device according to claim 1, wherein the substrate and the first electrode $E_i$ are light transparent.

10. A device as in claim 1 wherein said oxidized portion is formed in the upper hald of said non-single-crystal semiconductor laminate member.

* * * * *